(12) United States Patent
Cheng et al.

(10) Patent No.: US 9,063,172 B1
(45) Date of Patent: Jun. 23, 2015

(54) STEP CONNECTORS IN TEST FIXTURE FOR PACKAGED DEVICE MEASUREMENT

(71) Applicant: M/A-COM Technology Solutions Holdings, Inc., Lowell, MA (US)

(72) Inventors: Anson C. S. Cheng, Hsinchu (TW); Lung-Hung Ni, Kaohslung (TW)

(73) Assignee: M/A-COM Technology Solutions Holdings, Inc., Lowell, MA (US)

( * ) Notice: Subject to any disclaimer, the term of this patent is extended or adjusted under 35 U.S.C. 154(b) by 184 days.

(21) Appl. No.: 13/895,617

(22) Filed: May 16, 2013

(51) Int. Cl.
*G01R 1/067* (2006.01)
*G01R 1/04* (2006.01)
*H05K 13/00* (2006.01)

(52) U.S. Cl.
CPC ............. *G01R 1/0416* (2013.01); *H05K 13/00* (2013.01)

(58) Field of Classification Search
CPC ............................. G01R 1/0416; H05K 13/00
USPC ........ 324/500, 755.01–756.04; 257/E23.171, 257/E21.526, E23.079, E23.179; 438/14–18, 50, 53
See application file for complete search history.

(56) References Cited

U.S. PATENT DOCUMENTS

| | | | |
|---|---|---|---|
| 4,697,143 A | 9/1987 | Lockwood et al. | 324/158 P |
| 6,441,606 B1 * | 8/2002 | Caldwell et al. | 324/750.05 |
| 7,278,855 B2 * | 10/2007 | Yasumura et al. | 439/65 |
| 7,474,111 B2 | 1/2009 | Narita | 324/754 |
| 7,681,312 B2 | 3/2010 | Gleason et al. | 29/857 |
| 8,124,429 B2 * | 2/2012 | Norman | 438/17 |
| 8,988,093 B2 * | 3/2015 | Rathburn | 324/755.01 |
| 2006/0006892 A1 * | 1/2006 | Green et al. | 324/755 |
| 2010/0148352 A1 * | 6/2010 | Moden | 257/692 |

* cited by examiner

*Primary Examiner* — Melissa Koval
*Assistant Examiner* — Trung Nguyen
(74) *Attorney, Agent, or Firm* — Christopher P. Maiorana, PC

(57) ABSTRACT

A method for creating step connectors in a test fixture is disclosed. The method generally includes steps (A) and (B). Step (A) may form the connectors in a plurality of regions of a board by reducing a thickness of a metal outside the regions by a distance. Each region generally corresponds to a respective one of a plurality of pads of a package of a device under test. The distance may be measured normal to the board. The distance generally provides a clearance between the board and the package sufficient to make physical and electrical contact between the connectors and the pads. Step (B) may form a plurality of traces on the board. Each trace may (i) be made of the metal and (ii) intersect a respective one of the regions.

20 Claims, 5 Drawing Sheets

US 9,063,172 B1

STEP CONNECTORS IN TEST FIXTURE FOR PACKAGED DEVICE MEASUREMENT

FIELD OF THE INVENTION

The present invention relates to test fixtures generally and, more particularly, to a method and/or apparatus for implementing step connectors in a test fixture for packaged device measurement.

BACKGROUND OF THE INVENTION

Radio-frequency devices that operate in the microwave/millimeter wave range are being used in a growing number of applications. Uniform testing of such devices in test fixtures is becoming difficult due to high-frequency input/output signals. Conventional test fixtures implement pogo pins, pin-less interposer sheets, inter-connector films and no-pin techniques to establish electrical connections between the device under test and test circuitry coupled to the text fixture. The conventional connections have problems maintaining uniform contacts during test measurements and wear out routinely in mass production environments.

It would be desirable to implement step connectors in a test fixture for packaged device measurement.

SUMMARY OF THE INVENTION

The present invention concerns a method for creating step connectors in a test fixture is disclosed. The method generally includes steps (A) and (B). Step (A) may form the connectors in a plurality of regions of a board by reducing a thickness of a metal outside the regions by a distance. Each region generally corresponds to a respective one of a plurality of pads of a package of a device under test. The distance may be measured normal to the board. The distance generally provides a clearance between the board and the package sufficient to make physical and electrical contact between the connectors and the pads. Step (B) may form a plurality of traces on the board. Each trace may (i) be made of the metal and (ii) intersect a respective one of the regions.

The objects, features and advantages of the present invention include providing step connectors in a test fixture for packaged device measurements that may (i) provide effective connections to a device under test during measurements, (ii) provide uniform connections to the device under test, (iii) provide robust connections, (iv) provide low-cost connections and/or (v) be implemented on a printed circuit board.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Some embodiments generally provide a circuit board suitable for use in a test fixture to create electrical and physical connections to a device under test. The text fixture generally holds the device under test while measurements are made during test operations. The circuit board contains multiple traces that may be used for electrical communications with the device under test. Each trace has one or more connectors that may extend up from the board to interface with the device under test. Each connector generally has a step shape. The traces may convey unidirectional and/or bidirectional signals to and from the device under test. The signals may include, but are not limited to power signals, ground signals, bias signals, control signals, reference signals and high-frequency signals. The high-frequency signals may include, but are not limited to radio frequency signals, microwave signals (e.g., 300 megahertz to 300 gigahertz) and millimeter wave signals (e.g., 30 gigahertz to 300 gigahertz).

Figure 1:
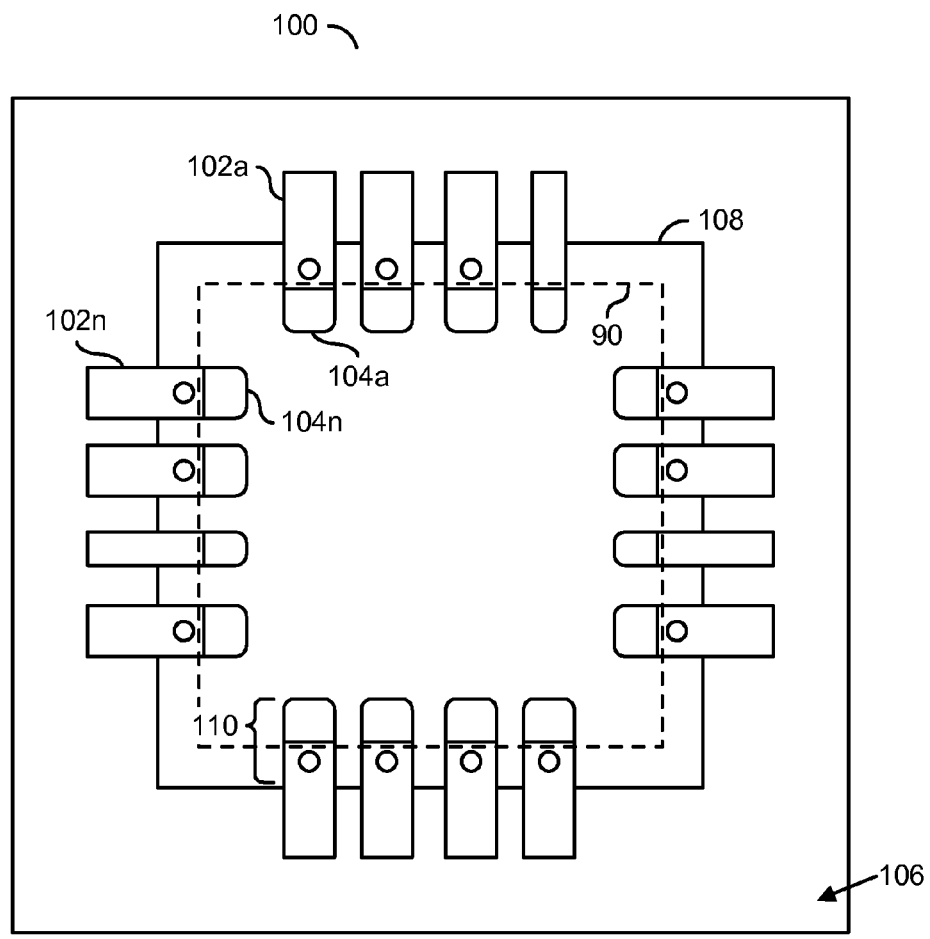
FIG. 1 is a diagram of an example implementation of a circuit board.

Referring to FIG. 1, a diagram of an example implementation of an apparatus 100 is shown. The apparatus (or device or board) 100 may be implemented as a circuit board. The circuit board 100 generally comprises a core (or substrate) with multiple traces (or lines) 102a-102n patterned on a front surface 106 of the core. Each trace 102a-102n may include a region (or area) in which a connector (or pad) 104a-104n is formed. The connectors 104a-104n each have a generally flat surface that is coplanar with the surfaces of the other connectors 104a-104n. An open area 108 may be cut through the circuit board 100. Each connector 104a-104n is generally positioned at an end of a respective finger-like cantilever 110 that is formed in the circuit board 100 and extends into the open area 108. A device 90 may be aligned to the connectors 104a-104n and brought into physical and electrical contact with the connectors 104a-104n during a test of the device 90. The cantilevers 110 may flex slightly to account for any mismatches between the connectors 104a-104n and respective electrical pads of the device 90.

Figure 2:
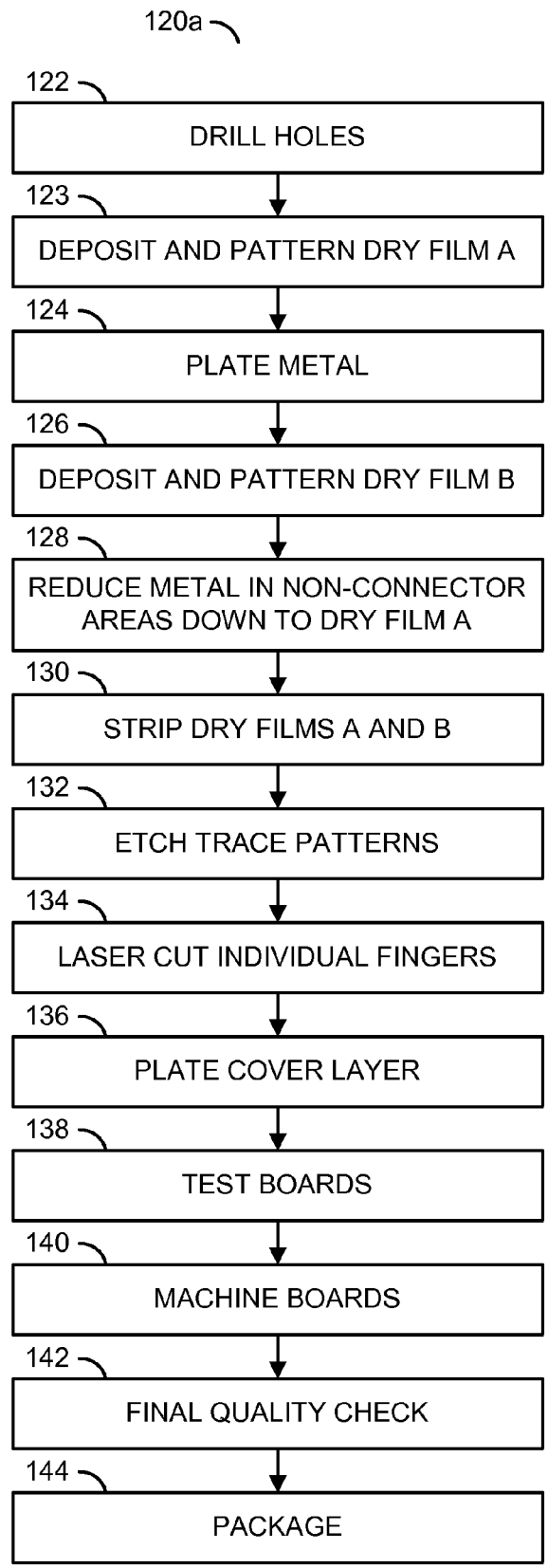
FIG. 2 is a flow diagram of a method for fabricating the circuit board in accordance with a preferred embodiment of the present invention.

Referring to FIG. 2, a flow diagram of a method 120a for fabricating the circuit board 100 is shown in accordance with a preferred embodiment of the present invention. The method (or process) 120a may be performed using common printed circuit board fabrication equipment. The method 120a generally comprises a step (or state) 122, a step (or state) 123, a step (or state) 124, a step (or state) 126, a step (or state) 128, a step (or state) 130, a step (or state) 132, a step (or state) 134, a step (or state) 136, a step (or state) 138, a step (or state) 140, a step (or state) 142 and a step (or state) 144. The sequence of the steps is shown as a representative example. Other step orders may be implemented to meet the criteria of a particular application.

In the method 120a generally starts with a circuit board substrate that already has a conductive layer (e.g., copper) pre-bonded to one or both sides. The substrate may have dimensions sufficient to fabricate one or more circuit boards 100 at a time. Multiple holes may be drilled through the pre-bonded conductive layers and substrate in the step 122. In the step 123, an inner dry film (e.g., dry film A) may be deposited over at least the front surface 106 of the substrate and patterned to cover areas outside the connectors 104a-104n. The back surface may optionally be covered with the inner dry film. In the step 124, additional metal (e.g., more copper) may be plated onto the pre-bonded conductive layers through vias patterned in the inner dry film to increase an overall thickness of the layers. The additional metal may spread over and cover some or all of the inner dry film.

An outer dry film (e.g., dry film B) is deposited over the at least the front surface 106 of the substrate in the step 126 and patterned to cover the connectors 104a-104n. If not already covered by the inner dry film, the back surface may optionally be covered with the outer dry film. The thickness of the uncovered areas of the conductive layer on the front surface 106, and optionally on the back surface, is generally reduced (or removed) down to the inner dry film in the step 128. The reduction leaves the connectors 104a-104n at a height above the rest of the surrounding conductive layer. Both dry films may be stripped in the step 130.

In the step 132, the traces 102a-102n may be patterned and etched into the conductive layer. A laser (e.g., an ultra-violet laser) may be used in the step 134 to cut the substrate. The cuts may form the open area 108. The individual fingers 110 for each trace 102a-102n may also be cut by the laser.

In the step 136, one or more cover (or protective or outer) layers may be plated over the conductive layers on both the front side 106 and a back side of the substrate. Each cover layers generally comprises one or more metal layers and/or alloys. In some embodiments, the cover layers may include a nickel layer deposited on the copper layer and a gold layer deposited on the nickel layer. Other metals and/or alloys may be used to meet the criteria of a particular application.

The individual circuit boards 100 may be electrically tested in the step 138. Circuit boards 100 which fail the electrical tests are generally marked as such. In cases where the substrate contains multiple circuit boards 100, the substrate is machined in the step 140 to separate the individual circuit boards 100. A final quality check of each circuit board 100 may be performed in the step 100. The circuit boards 100 which pass the final quality check are typically packaged in the step 144 prior to storage and/or transfer to the location where the test fixtures are located.

Figure 3:
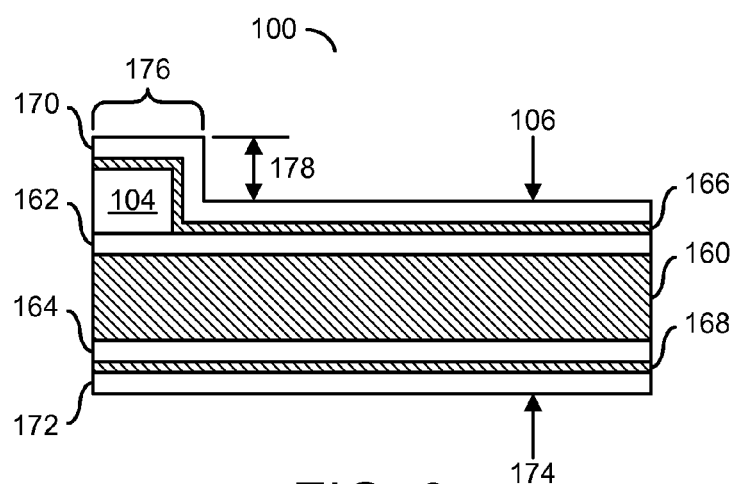
FIG. 3 is a cross-sectional diagram illustrating multiple layers of the circuit board.

Referring to FIG. 3, a cross-sectional diagram illustrating multiple layers of the circuit board 100 is shown. The circuit board 100 generally comprises a board core (or substrate) 160, a layer (or film) 162, a layer (or film) 164, a layer (or film) 166, a layer (or film) 168, a layer (or film) 170 and a layer (or film) 172. The layer 170 may be an outside layer on the front surface 106 of the circuit board 100. The layer 172 may be an outside layer on a back surface 174 of the circuit board 100. A connector 104 is formed in the region 176. The connector 104 generally has a height 178 as measured normal to the board core 160. The connector 104 may be representative of the connectors 104a-104n illustrated in FIG. 1.

The board core 160 may be implemented as a liquid crystal polymer. The board core 160 generally has a thickness of approximately 100 micrometers (e.g., µm). Other materials and/or thicknesses may be used for the board core 160 to meet the criteria of a particular application.

The layers 162 and 164 may be implemented as the conductive layers. The layers 164 and 162 generally comprise the pre-bonded copper layers and the plated copper layers. The pre-bonded layers may have a thickness of approximately 18 µm. The connector 104 generally adds an additional thickness of approximately 50 µm (e.g., the height 178). Other materials and/or thicknesses may be used for the layers 162 and 164 to meet the criteria of a particular application.

The layers 166 and 168 may be implemented as inner portions of the cover layer. The layers 166 and 164 generally comprise nickel layers. Each layer 166 and 168 may have a thickness of approximately 200 µm. The layers 166 and 168 may act as adhesion layers to aid in connecting the outermost power of the cover layers to the conductive layers. Other materials and/or thicknesses may be used for the layers 165 and 168 to meet the criteria of a particular application.

The layers 170 and 172 may be implemented as outer portions of the cover layers. The layers 170 and 172 generally comprise gold layers. Each layer 166 and 172 may have a thickness of approximately 5 µm. The layers 170 and 172 may protect the layers 162 and 164 from corrosion due to moisture in the atmosphere. The layer 170 may also provide good electrical connections to the device 90 during the tests.

The layers 164, 168 and 172 along the bottom surface 174 of the circuit board 100 are generally patterned as a (solid) ground plane. The ground plane and thickness of the board core 160 typically influence transmission line (or stripline) characteristics of the traces 102a-102n that carry the high-frequency signals. Adjusting the thickness and/or material of the board core 160 and/or adjusting the shape of the traces 102a-102n generally alters an impedance characteristic of the traces 102a-102n.

Figure 4:
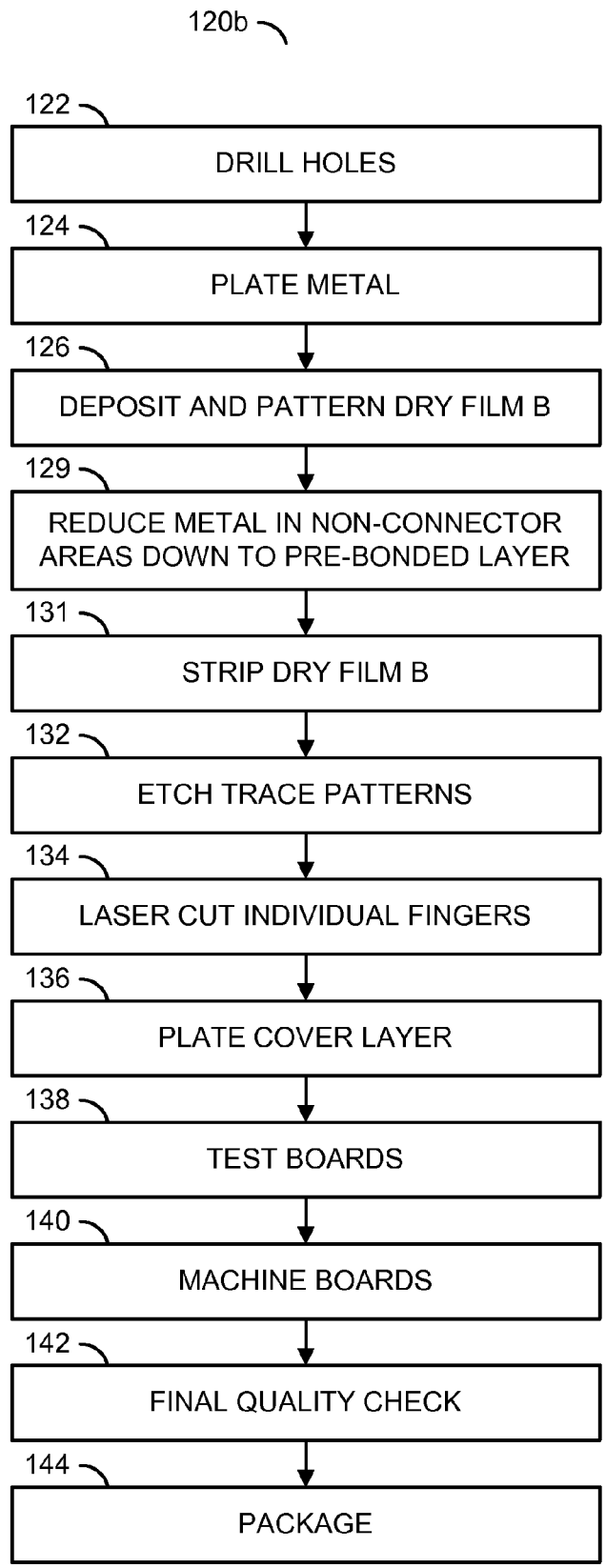
FIG. 4 is a flow diagram of a method for fabricating the circuit board

Referring to FIG. 4, a flow diagram of a method 120b for fabricating the circuit board 100 is shown in accordance with a preferred embodiment of the present invention. The method 120b may be a variation of the method 120a. The method (or process) 120b may be performed using common printed circuit board fabrication equipment. The method 120b generally comprises the step 122, the step 124, the step 126, a step (or state) 129, a step (or state) 131, the step 132, the step 134, the step 136, the step 138, the step 140, the step 142 and the step 144. The sequence of the steps is shown as a representative example. Other step orders may be implemented to meet the criteria of a particular application.

In the method 120b generally starts with a circuit board substrate that already has a conductive layer (e.g., copper) pre-bonded to one or both sides. The substrate may have dimensions sufficient to fabricate one or more circuit boards 100 at a time. Multiple holes may be drilled through the pre-bonded conductive layers and substrate in the step 122. In the step 124, additional metal (e.g., more copper) may be plated onto the pre-bonded conductive layers to increase an overall thickness of the layers.

The outer dry film is deposited over the at least the front surface 106 of the substrate in the step 126 and patterned to cover the connectors 104a-104n. The back surface may optionally be covered with the outer dry film. The thickness of the uncovered areas of the conductive layer on the front surface 106, and optionally on the back surface, is generally reduced (or removed) down to the pre-bonded layer 162 in the step 129. The reduction leaves the connectors 104a-104n at a height above the rest of the surrounding conductive layer. The outer dry film may be stripped in the step 131. The remaining steps 132-144 of the method 120b are generally the same as in the method 120a.

Figure 5:
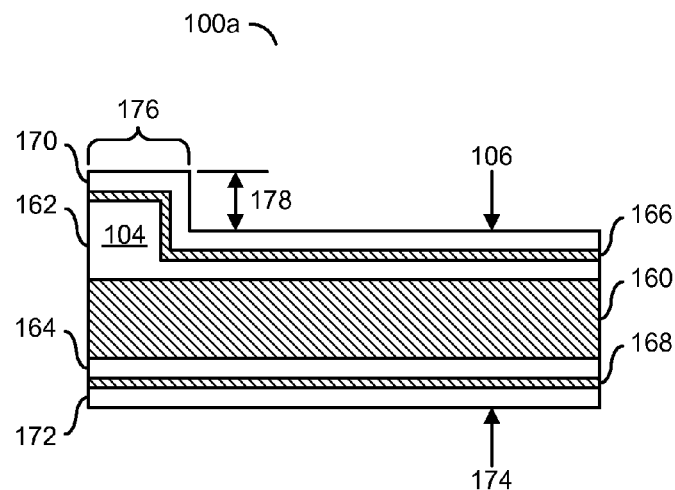
FIG. 5 is another cross-sectional diagram illustrating multiple layers of the circuit board.

Referring to FIG. 5, another cross-sectional diagram illustrating multiple layers of a circuit board 100a is shown. The circuit board 100a may be a variation of the circuit board 100. In some situations, the steps 123 and 124 in the method 120a and/or the step 124 in the method 120b may be eliminated. If the pre-bonded conductive layer 162 is sufficiently thick, the plating of the additional metal layer may be avoided. As such, the reduction of the metal in the uncovered areas may be applied to the pre-bonded conductive layer rather than the plated metal layer.

Figure 6:
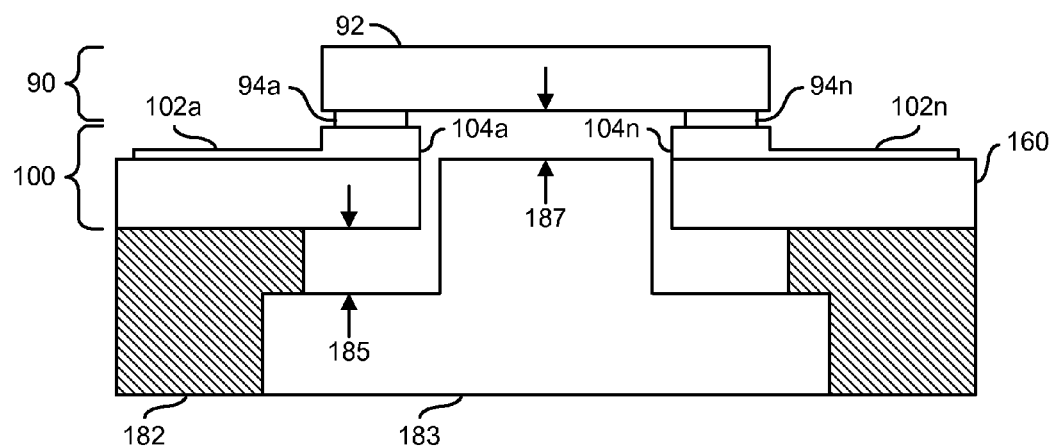
FIG. 6 is a diagram of a device under test connected to the circuit board.

Referring to FIG. 6, a diagram of the device 90 connected to the circuit board 100 is shown. The device 90 may comprise a package (or substrate or carrier) 92 and multiple input/output pads (or contacts) 94a-94n. Electrical circuitry may be housed inside the package 92 and electrically connected to the pads 94a-94n. The pads 94a-94n each have a generally flat surface that are coplanar with each other. The pads 94a-94n generally correspond one-to-one with the connectors 104a-104n, respectively. Each pad 94a-94n may align with a respective connector 104a-104n of the circuit board 100 during the tests.

The circuit board 100 is commonly mounted on a base plate 182. The base plate 182 generally comprises a metal material. The base plate 182 may have an opening generally aligned with the open area 108 of the circuit board 100. A slug 183 is disposed in the opening of the base plate 182. The slug 183 may also comprise a metal material. A gap 185 may be established between the slug 183 and the bottom surface of the circuit board 100. When the device 90 is brought into contact with the circuit board 100, the fingers 110 generally bend (or spring) into the gap 185 a short distance. A gap 187 may also be established between the slug 183 and the package 92. The gap 187 may be smaller than the gap 185. The gap 187 is generally sized to limit the distance that the fingers 110 may be bent by limiting the movement of the device 90 toward the slug 183. The limit may prevent damage to the fingers 110.

To test the device 90, the package 92 is oriented with respect to the circuit board 100 such that the pads 94a-94n and the respective connectors 104a-104n are in electrical and physical contact with each other. A force of approximately 2 to 4 pounds may be applied to the device 90 to maintain the electrical connections between the pads 94a-94n and the connectors 104a-104n. Power, ground, control signals, reference signals, input signals, output signal and any other appropriate test signals may be transferred between the circuit board 100 and the device 90 through the traces 102a-102n and the interfaces formed between the pads 94a-94n and the connectors 104a-104n.

Figure 7:
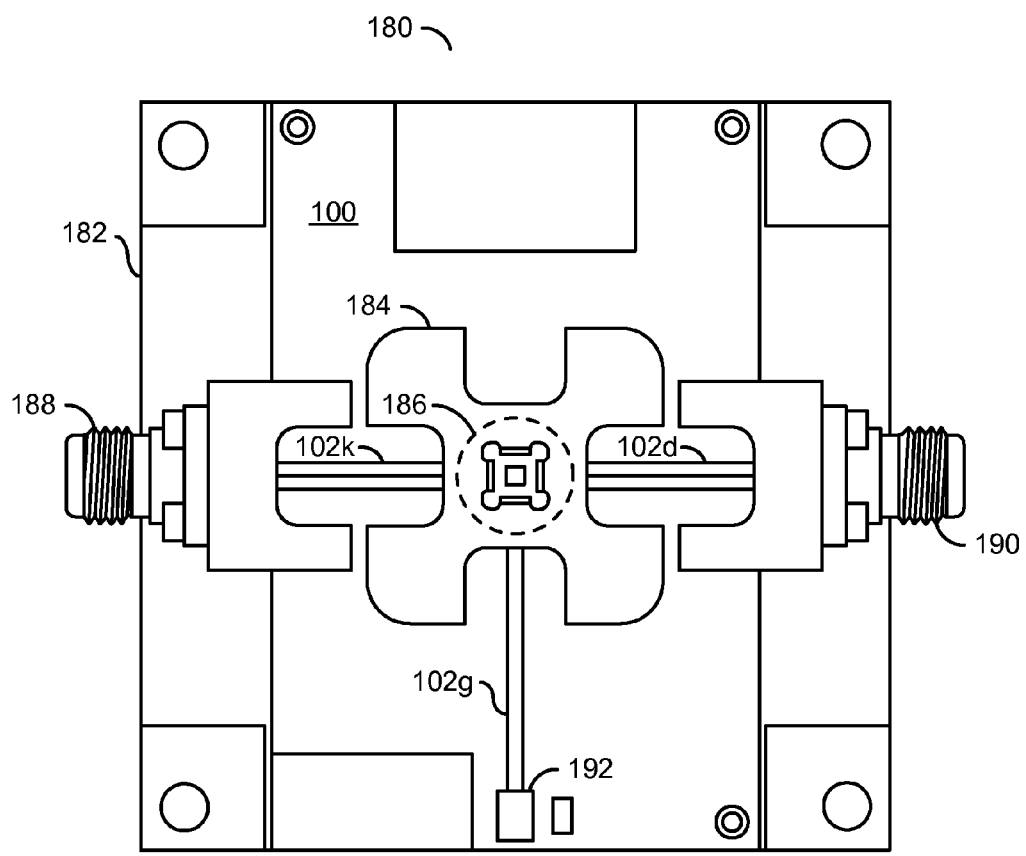
FIG. 7 is a diagram of an example implementation of a test fixture that incorporates the circuit board.

Referring to FIG. 7, a diagram of an example implementation of a test fixture 180 that incorporates the circuit board 100 is shown. The fixture (or test rig) 180 generally comprises the circuit board 100, the base plate 182, a guide frame 184, a slot 186 in the guide frame 184, one or more high-frequency input connectors 188, one or more high-frequency output connectors 190 and multiple input/output pads 192.

The circuit board 100 may be positioned between the base plate 182 and the guide frame 184. The slot 186 of the guide frame 184 is generally aligned around the connectors 104a-104n such that the device 90 establishes electrical connections with the circuit board 100 when mounted inside the slot 186. A shape of the slot 186 generally matches a shape of the package 92. Multiple traces 102a-102n (e.g., traces 102k and 102d) are connected to the high-frequency connectors 188 and 190 to form a high-frequency path. Some of the traces 102a-102n (e.g., trace 102g) may be connected to the input/output pads 192 to convey power, ground, control signals, reference signals and any other test signals appropriate for the measurements and tests being conducted.

The test fixture 180 generally provides an ability to automate the testing of the device 90. The interfaces formed between the pads 94a-94n of the device 90 and the connectors 104a-104n in the test fixture 180 may be effective and uniform while measurements/test are being performed. Life cycle testing of the connectors 104a-104n generally show minimal wear after 10,000 touch downs and lift offs. The step-shape connectors 104a-104n are generally suitable for any printed circuit board connect of any test fixtures.

The functions and structures illustrated in the diagrams of FIGS. 1-7 may be designed, modeled and simulated using one or more of a conventional general purpose processor, digital computer, microprocessor, microcontroller and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally executed from a medium or several media by one or more of the processors.

While the invention has been particularly shown and described with reference to the preferred embodiments thereof, it will be understood by those skilled in the art that various changes in form and details may be made without departing from the scope of the invention.

The invention claimed is:

1. A method for creating step connectors in a test fixture, comprising the steps of:
   (A) reducing a thickness of a metal outside a plurality of regions of a board to form said connectors, wherein (i) each of said regions corresponds to a respective one of a plurality of pads of a package of a device under test, (ii) said connectors have a height above a surrounding surface as measured normal to said board and (iii) said height provides a clearance between said surrounding surface and said package sufficient to permit both physical contact and electrical contact between said connectors and said pads;
   (B) forming a plurality of traces on said board, wherein each of said traces (i) comprises said metal and (ii) intersects a respective one of said regions;
   (C) creating an open area extending through said board approximate said connectors; and
   (D) cutting said board to form a plurality of cantilevers, wherein each of said cantilevers (i) supports a respective one of said connectors and (ii) is flexible normal to said board.

2. The method according to claim 1, further comprising the step of:
   installing said board in said test fixture, wherein (i) said test fixture is configured to temporarily hold said package in a position where said connectors of said board align with said pads of said package and (ii) said connectors have a step shape.

3. The method according to claim 1, further comprising the step of:
   forming an outer layer on said traces and said connectors after said cantilevers are cut.

4. The method according to claim 3, further comprising the step of:
   forming an adhesion layer on said traces, wherein said outer layer is formed on said adhesion layer.

5. The method according to claim 4, further comprising the step of:
   plating said metal used to make said connectors on a conductive layer of said board.

6. The method according to claim 5, further comprising the step of:
   patterning a dry film on said metal to shape said connectors when said metal is reduced.

7. The method according to claim 6, further comprising the step of:
   covering a side of said board opposite said connectors with said dry film to prevent said metal on said side from being reduced while said connectors are being formed.

8. The method according to claim 1, wherein at least two of said connectors convey radio frequency or higher signals.

9. The method according to claim 1, further comprising the step of:

forming a ground plane on a side of said board opposite said traces.

10. An apparatus fabricated in accordance with the method of claim 1.

11. The method according to claim 1, further comprising the step of:
drilling one or more holes in said board before said connectors are formed.

12. An apparatus comprising:
a board comprising a plurality of regions, wherein each of said regions corresponds to a respective one of a plurality of pads of a package of a device under test;
a plurality of traces formed by a reduction of a metal on said board, wherein each of said traces intersects a respective one of said regions;
a plurality of connectors formed with said metal in said regions, wherein (i) said connectors have a thickness extending said traces by a height above a surrounding surface as measured normal to said board and (ii) said height provides a clearance between said surrounding surface and said package sufficient to permit both physical contact and electrical contact between said connectors and said pads;
an open area extending through said board approximate said connectors; and
a plurality of cantilevers cut in said board, wherein each of said cantilevers (i) supports a respective one of said connectors and (ii) is flexible normal to said board.

13. The apparatus according to claim 12, further comprising a test fixture configured to temporarily hold said device in a position where said connectors of said board align with said pads of said package, wherein said connectors have a step shape.

14. The apparatus according to claim 12, further comprising an outer layer formed on said traces and said connectors after said cantilevers are cut.

15. The apparatus according to claim 14, further comprising an adhesion layer formed on said traces, wherein said outer layer is formed on said adhesion layer.

16. The apparatus according to claim 15, wherein said metal used to make said connectors is plated on a conductive layer of said board.

17. The apparatus according to claim 12, wherein at least two of said connectors convey radio frequency or higher signals.

18. The apparatus according to claim 17, further comprising a conductor on a side of said board opposite said traces and configured to form a transmission line with said traces to convey said radio frequency or higher signals, wherein said transmission line has an impedance characteristic determined by one or more properties of said board.

19. The apparatus according to claim 12, wherein said board (i) comprises a liquid crystal polymer and (ii) is approximately 100 micrometers thick.

20. The apparatus according to claim 12, wherein said board further comprises one or more holes drilled before said connectors are formed.

* * * * *